United States Patent [19]

Miyata et al.

[11] Patent Number: 4,591,465

[45] Date of Patent: May 27, 1986

[54] METHOD OF PRODUCING POLYMERIC ELECTRET ELEMENT

[75] Inventors: Seizo Miyata, 3-18-26, Shimohoya, Hoya-shi, Tokyo, Japan; Shigeru Tasaka, Tokyo; Kazuo Saito, Ibaraki; Iwao Seo, Ibaraki; Kenji Nakajima, Ibaraki; Takeshi Kosaka, Ibaraki, all of Japan

[73] Assignees: Mitsubishi Petrochemical Co., Ltd.; Seizo Miyata, both of Tokyo, Japan

[21] Appl. No.: 651,778

[22] Filed: Sep. 18, 1984

[30] Foreign Application Priority Data

Sep. 28, 1983 [JP] Japan ................. 58-179961

[51] Int. Cl.$^4$ ............. B29C 71/02; B29C 71/04
[52] U.S. Cl. ........................ 264/22; 264/24; 264/27; 264/234; 264/331.14
[58] Field of Search .......... 264/22, 24, 108, 235, 264/234, 345, 346, 331.14, 27

[56] References Cited

U.S. PATENT DOCUMENTS

| | | | |
|---|---|---|---|
| 2,373,093 | 4/1945 | Baker | 264/235 |
| 3,862,288 | 1/1975 | Su | 264/235 |
| 3,878,274 | 4/1975 | Murayama et al. | 264/24 |
| 3,991,451 | 11/1976 | Maruyama et al. | 264/345 |
| 4,248,808 | 2/1981 | West | 264/235 |
| 4,268,653 | 5/1981 | Uchidoi et al. | 264/22 |
| 4,302,408 | 11/1981 | Ichihara et al. | 264/22 |
| 4,346,505 | 8/1982 | Lemonon et al. | 264/22 |
| 4,434,114 | 2/1984 | Sprout, Jr. | 264/25 |

FOREIGN PATENT DOCUMENTS

| | | | |
|---|---|---|---|
| 55-16462 | 5/1980 | Japan | 264/24 |
| 69818/81 | of 1981 | Japan . | |
| 56-114901 | 9/1981 | Japan | 264/108 |
| 57-23286 | 2/1982 | Japan | 264/22 |

*Primary Examiner*—Jeffery Thurlow
*Attorney, Agent, or Firm*—Oblon, Fisher, Spivak, McClelland & Maier

[57] ABSTRACT

In producing an electret element having piezoelectric properties by subjecting a vinylidene cyanide copolymer to a polarization treatment, the copolymer is heat-treated at a temperature below the glass transition temperature thereof prior to or simultaneously with the polarization treatment to thereby increase the longitudinal piezoelectric effect ($K_t$).

17 Claims, No Drawings

METHOD OF PRODUCING POLYMERIC ELECTRET ELEMENT

FIELD OF THE INVENTION

The present invention relates to a method of producing a polymeric electret element having a high longitudinal piezoelectric effect and is thermally stable over long periods of time.

BACKGROUND OF THE INVENTION

It is well known that piezoelectric properties as an energy conversion function are characteristic of crystals not having a symmetric center. In fact, inorganic materials such as quartz crystal, Rochelle salt or lead zirconate titanate-based ceramics, are well used. These inorganic materials, however, have poor flexibility and are difficult to mold or process. Thus, piezoelectric materials having a large surface area, shaped in a thin membrane, or having a complicated form are very difficult to produce from inorganic materials, although they have a high piezoelectric modulus.

It is also known that stretched films, for example, of certain polymeric materials, e.g., natural polymers such as celluloses or proteins, and synthetic polymers such as poly-γ-methyl-L-glutamate, have piezoelectric properties. Moreover, it is known that electrets of other synthetic polymers, e.g., those produced by applying a high DC voltage to stretched films of, e.g., polyvinyl fluoride, polyvinylidene fluoride (PVDF), polyvinyl chloride, polyacrylonitrile (PAN), polycarbonate or nylon 11, while maintaining them at a high temperature and thereafter cooling the films have piezoelectric properties and of these electrets, PVDF containing an orientated Type I (Type β) crystal exhibits a high piezoelectric effect. These organic piezoelectric materials, however, have poor longitudinal piezoelectric effect although they are superior in moldability and flexibility. A high longitudinal piezoelectric effect is one of the objects that the present invention is intended to attain. For example, in the case of PVDF electrets, which exhibits the highest piezoelectric modulus, the longitudinal piezoelectric effect (Kt) is as small as 0.18 although they have a relatively high transverse piezoelectric effect ($d_{31}$) as high as 40 pC/N. Thus, the PVDF electrets are subject to serious limitations when they are used, particularly in applications where a high longitudinal piezoelectric effect is required, e.g., as transmitting and receiving elements of ultrasonic transducers.

The present invention is intended to overcome the above defects of the prior art inorganic or organic piezoelectric materials and provide organic piezoelectric materials which are superior in moldability and flexibility and exhibit a high longitudinal piezoelectric effect.

As a result of extensive studies on the mechanism of generation of piezoelectricity in PVDF electrets which are considered to have the highest piezoelectric modulus at present, it has been found that the piezoelectric properties of PVDF are ascribable mainly to the magnitude of C—F dipole moment and β-crystals having spontaneous polarizability. As a result of further studies to increase the dipole moment and to stabilize the orientation of dipole as a mean of molecular design, it has been discovered that vinylidene cyanide copolymers having a C—CN dipole moment which has a value higher than that of the C—F dipole moment, when subjected to a polarization treatment, exhibit excellent piezoelectric performance (Japanese Patent Application (OPI) No. 69818/81 (the term "OPI" as used herein means a "published unexamined Japanese patent application").

It has now been found that if vinylidene cyanide copolymers are subjected to a heat treatment prior to or simultaneously with poling, polymeric electret elements which have a large longitudinal piezoelectric effect (Kt) (although they have a poor transverse piezoelectric effect ($d_{31}$)) and are thermally stable over long periods of time, can be obtained. The present invention has been accomplished based on these findings.

SUMMARY OF THE INVENTION

The present invention has been accomplished based on the findings that the piezoelectric properties of vinylidene cyanide copolymers are greatly affected by the process of production and heat history that they undergo prior to poling and in turn by the structure thereof.

Accordingly, an object of the present invention is to provide a method of producing a polymeric electret element which exhibits a high longitudinal piezoelectric effect and is thermally stable over long periods of time.

The method of producing a polymeric electret element according to the present invention comprises heat-treating a molded article of a copolymer of vinylidene cyanide represented by the following formula:

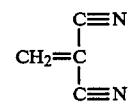

and other vinyl, vinylidene or diene compounds at a temperature not higher than the glass transition temperature of the copolymer prior to or simultaneously with poling.

DETAILED DESCRIPTION OF THE INVENTION

Vinylidene cyanide copolymers as used herein are prepared by copolymerization or alternating copolymerization of vinylidene cyanide and other vinyl, vinylidene or diene compounds.

Examples of other vinyl, vinylidene and diene compounds include styrene, dichlorostyrene, acrylic acid and its esters, methacrylic acid and its esters, vinyl alcohol and its esters, vinyl chloride, vinylidene chloride, vinyl fluoride, vinylidene fluoride, ethylene trifluoride, butadiene, chlorobutadiene, isobutylene, maleic anhydride, acrylonitrile, α-chloroacrylonitrile, methyl vinyl ketone, vinyl isobutyl ether, and cyano acrylate. Ester compounds may be partially or entirely subjected to chemical modification such as hydrolysis after the polymerization thereof. It is to be noted that the present invention is not limited to the above-described compounds.

The molar ratio of vinylidene cyanide to the other monomer is preferably from 0.5:1 to 1.5:1. More preferably, the vinylidene cyanide copolymer of the present invention is an alternating copolymer, i.e., in which the molar ratio of vinylidene cyanide to the other monomer is 1:1.

The molecular weight of the vinylidene cyanide copolymer of the present invention is such that the intrinsic viscosity (as determined in a solvent of dimethylformamide at a temperature of 25° C.) is from 0.1 to 15, preferably from 0.5 to 13, and more preferably from 2 to 7.

The vinylidene cyanide copolymer of the present invention can be molded by techniques such as press molding, extrusion molding, calender molding or solvent casting. In any case, the molded article is preferably stretched to from 2 to 6 times. In this stretching, it is desirable that the molded article be subjected to mechanical monoaxial or biaxial stretching using a roll or calender rolling or stretching apparatus. In addition, a stretched film can be produced by stretching simultaneously with molding such as inflation molding.

In accordance with the method of the present invention, the stretched or unstretched vinylidene cyanide copolymer molded into a desired form such as a film, a sheet or a fiber is heat-treated at a temperature not higher than the glass transition temperature of the copolymer prior to or simultaneously with the poling.

This heat-treatment is carried out within a temperature range of from 0° to 80° C., preferably from 0° to 30° C., lower than the glass transition temperature of the molded article. The glass transition temperature of the molded article refers to a temperature corresponding to a peak of an endothermic curve as determined by means of a differential scanning calorimeter (sample: several milligrams; rate of temperature rise: 10° C./min).

At temperatures more than 80° C. lower than the glass transition temperature of the vinylidene cyanide copolymer, the heat-treatment time is undesirably lengthened. On the other hand, at temperatures above the glass transition temperature, the heat-treatment effect cannot be obtained.

When amorphous polymers such as vinylidene cyanide copolymers are heat-treated at temperatures not higher than the glass transition temperature thereof, the glass transition temperature changes. On continuing the heat-treatment, the glass transition temperature reaches an equilibrium value. Thus, taking into consideration the above phenomenon, the optimum heat-treatment time is determined. That is, a heat-treatment time required until the glass transition temperature does not change and reaches an equilibrium value is determined experimentally and it is preferred that the heat-treatment be performed for the time longer than the above-determined heat-treatment time.

In general, the heat-treatment time is determined in relation to the heat-treatment temperature, i.e., determined by the following equation:

$$\frac{t_1}{(T_g^0 - T_1) + 80} + \frac{t_2}{(T_g^1 - T_2) + 80} > A$$

wherein
$t_1$ = heat-treatment time (hr)
$t_2$ = polarization-treatment time (hr)
$T_g^0$ = glass transition point (°C.) of copolymer prior to heat-treatment
$T_g^1$ = glass transition point (°C.) of copolymer prior to polarization-treatment
$T_1$ = heat-treatment temperature
$T_2$ = polarization-treatment temperature
$A = 1/80$
provided that $t_1$ does never become negative.

When the heat-treatment and the polarization treatment are carried out at the same time, the polarization treatment time ($t_2$) is 0, i.g., $$\frac{t_2}{(T_g^1 - T_2) + 80} = 0$$

Thus, the above equation is $$\frac{t_1}{(T_g^0 - T_1) + 80} > A$$

A is 1/80, preferably 1/30, and more preferably ⅛.

In general, the heat-treatment is carried out over a period of from 2 to 50 hours, preferably from 2.5 to 30 hours.

The heat-treatment is applied prior to or simultaneously with poling. Alternatively a procedure can be employed in which the heat-treatment is partially applied prior to the poling and completed during the poling.

The poling can be carried out by two procedures. In accordance with one of the procedures, a molded article which has been heat-treated is heated to a predetermined temperature, a high DC electric field or a high DC electric field resulting from superposition of alternating electric fields is applied to the molded article from both the top and bottom sides for a predetermined time while maintaining the predetermined temperature and, thereafter, the molded article is gradually cooled or quenched. In the other procedure, simultaneously with the above heat-treatment, the high DC electric field or high DC electric field resulting from superposition of alternating electric fields is applied to the molded article from both the top and bottom sides for a predetermined period and, thereafter, the molded article is gradually cooled or quenched. The optimum temperature in conducting the poling varies depending upon the type of the copolymer. The poling temperature is usually from 0° to 180° C., preferably from 0° to 100° C., more preferably from 0° to 30° C. lower than the glass transition temperature of the molded article to be subjected to poling, usually the molded article heat-treated.

The polarization treatment is carried out using metallic foils, metallic plates or electrically conductive pastes provided on both sides of the usual molded article, or metallic coatings vacuum deposited or chemically plated on the both sides thereof as electrodes. The voltage to be applied is generally from 10 kv/cm to an electric field strength to the extent that dielectric breakdown does not occur and preferably from 100 to 1,500 kv/cm. The polarization time is not critical, but in the case of molded articles which have been heat-treated, it is from 10 minutes to 5 hours and preferably from 10 minutes to 2 hours.

The present invention is described in greater detail by reference to the following examples although it is not intended to be limited thereto.

The value of $d_{31}$ indicating a transverse piezoelectric effect was determined from the quantity of electric charge formed on the surface of a specimen at 110 Hz using Vibron-II (manufactured by Toyo Boldwin Co., Ltd.) and the stress on the cross section of the specimen. The electromechanical coupling coefficient $K_t$ to judge the longitudinal piezoelectric effect was determined by analyzing an electric impedance in the neighborhood of resonance point while applying a high frequency electric voltage (1 to 50 MHz) to the specimen.

EXAMPLE 1

4 parts by weight of an alternating copolymer of vinylidene cyanide and vinyl acetate was dissolved in 100 parts by weight of N,N-dimethylacetamide (DMA). The resulting solution was then cast onto a glass plate and dried under reduced pressure at 80° C. for 24 hours. The thus-formed film was washed with supersonic waves for 30 minutes in a 1:1 (vol. ratio) mixed solvent of acetone and methanol and, thereafter, dried under reduced pressure at 80° C. for 1 hour to remove DMA. The film was then heat-treated in the manner such that the film was heated to 150° C. and maintained at that temperature for various times, 1 hour, 2 hours, 5 hours and 10 hours, while keeping the film length constant and, thereafter, quenched to room temperature, whereby a 100 μm thick film was obtained.

The film was sandwiched between aluminum foil electrodes and then was subjected to a polarization treatment at temperatures as shown in Table 1 in an electric field of 400 kv/cm for 1 hour. The thus-obtained polymeric electret element was measured for the piezoelectric constants, $d_{31}$ and $K_t$. The results obtained are shown in Table 1 below.

The glass transition temperature of the film prior to the heat-treatment was 155° C., and glass transition temperatures thereof after the heat-treatment were as follows:

| Heat-Treatment Time (hr) | Glass Transition Temperature (°C.) |
| --- | --- |
| 1 | 158 |
| 2 | 170 |
| 5 | 175 |
| 10 | 175 |

TABLE 1

| Run No. | Heat-Treatment Temperature (°C.) | Heat-Treatment Time (hr) | Polarization Temperature (°C.) | $d_{31}$ (pC/N) | $K_t$ |
| --- | --- | --- | --- | --- | --- |
| 1 | 150 | 1 | 150 | 3.2 | 0.09 |
| 2 | 150 | 2 | 100 | 1.5 | — |
| 3 | 150 | 2 | 150 | 5.3 | 0.15 |
| 4 | 150 | 2 | 160 | 8.0 | 0.20 |
| 5 | 150 | 5 | 150 | 6.2 | 0.18 |
| 6 | 150 | 10 | 25 | 0.6 | — |
| 7 | 150 | 10 | 120 | 4.1 | 0.10 |
| 8 | 150 | 10 | 150 | 6.8 | 0.18 |
| 9 | 150 | 10 | 170 | 8.4 | 0.22 |
| 10 | — | — | 150 | 2.2 | 0.05 |

It can be seen from Table 1 that even vinylidene cyanide copolymer which had not been subjected to stretching treatment have satifactory longitudinal piezoelectric properties.

EXAMPLE 2

The non-heat-treated film obtained in Example 1 was uniaxially stretched to 3 times in an oven maintained at 150° C. to produce an oriented film. This orientated film was then heat-treated in the manner such that the film was heated at 160° C. for 2 hours at a constant film length, whereby a heat-treated film having a thickness of 30 to 50 μm was obtained.

On both surfaces of the film was vacuum deposited gold to provide gold electrodes. The film was then subjected to a polarization treatment under conditions as shown in Table 2 through the gold electrodes. The thus-obtained polymeric electret element was measured for the piezoelectric constants, $d_{31}$ and $K_t$. The results obtained are shown in Table 2 below. The glass transition temperature of the oriented film prior to the heat-treatment was 165° C. and after the 2 hour-heat-treatment, 178° C.

TABLE 2

| | Heat-Treatment Conditions | | Polarization Treatment Conditions | | | Piezoelectric Constants | |
| --- | --- | --- | --- | --- | --- | --- | --- |
| Run No. | Temperature (°C.) | Time (hr) | Temperature (°C.) | Electric Field Strength (kv/cm) | Time (hr) | $d_{31}$ (pC/N) | $K_t$ |
| 1 | 160 | 2 | 25 | 400 | 2 | 1.3 | — |
| 2 | 160 | 2 | 25 | 1,500 | 0.5 | 5.6 | 0.15 |
| 3 | 160 | 2 | 25 | 1,500 | 1 | 5.8 | 0.15 |
| 4 | 160 | 2 | 100 | 400 | 2 | 3.1 | 0.08 |
| 5 | 160 | 2 | 160 | 400 | 0.5 | 3.0 | 0.09 |
| 6 | 160 | 2 | 160 | 400 | 1 | 5.2 | 0.14 |
| 7 | 160 | 2 | 160 | 400 | 2 | 10.1 | 0.24 |
| 8 | 160 | 2 | 170 | 200 | 2 | 3.3 | 0.09 |
| 9 | 160 | 2 | 170 | 400 | 0.5 | 5.0 | 0.12 |
| 10 | 160 | 2 | 170 | 400 | 1 | 8.3 | 0.20 |
| 11 | 160 | 2 | 170 | 400 | 2 | 10.2 | 0.25 |
| 12 | 160 | 2 | 170 | 400 | 5 | 10.5 | 0.25 |
| 13 | 160 | 2 | 170 | 800 | 0.5 | 8.0 | 0.20 |
| 14 | 160 | 2 | 170 | 800 | 1 | 12.4 | 0.28 |
| 15 | 160 | 2 | 170 | 800 | 2 | 18.0 | 0.35 |

EXAMPLE 3

An alternating copolymer of vinylidene cyanide and vinyl acetate was press-molded in the conventional manner to produce a substantially unoriented film having a thickness of about 100 μm.

This film was uniaxially stretched to about 3 times in an oven maintained at 160° C. and sandwiched between copper plate electrodes while applying tension in the stretching direction. In this condition, the film was subjected to a polarization treatment and a heat-treatment at the same time under conditions as shown in Table 3. The thus-obtained electret element was measured for the piezoelectric constants, $d_{31}$ and $K_t$. The results obtained are shown in Table 3 below.

The glass transition temperature of the copolymer after stretching was 168° C.

TABLE 3

| | Polarization/Heat-Treatment Conditions | | | Piezoelectric Constants | |
| --- | --- | --- | --- | --- | --- |
| Run No. | Temperature (°C.) | Electric Field Strength (kv/cm) | Time (hr) | $d_{31}$ (pC/N) | $K_t$ |
| 1 | 100 | 400 | 2 | 1.2 | — |
| 2 | 100 | 400 | 5 | 2.5 | — |
| 3 | 100 | 400 | 10 | 2.8 | 0.08 |
| 4 | 160 | 200 | 2 | 2.3 | 0.08 |
| 5 | 160 | 400 | 2 | 5.5 | 0.16 |
| 6 | 160 | 400 | 5 | 10.1 | 0.23 |
| 7 | 160 | 400 | 10 | 12.2 | 0.28 |
| 8 | 160 | 800 | 2 | 10.0 | 0.23 |
| 9 | 160 | 800 | 5 | 21.8 | 0.38 |
| 10 | 160 | 800 | 10 | 18.3 | 0.33 |

EXAMPLE 4

An alternating copolymer of vinylidene cyanide and methyl methacrylate was dissolved in DMA. Using the thus-prepared solution, a film was produced by the solvent casting method. This film was uniaxially stretched to 3 times in a silicone oil maintained at 120° C. and then heat-treated in the manner such that the film was heated at a constant film length in an oven maintained at 130° C. for various times, 1 hour, 2 hours, 5 hours, and 10 hours, whereby an 80 μm thick film was obtained. This film was then subjected to a polarization treatment in an electric field of 400 kv/cm for 2 hours at temperatures as shown in Table 4. The thus-obtained film was measured for the piezoelectric constants, $d_{31}$ and $K_t$. The results obtained are shown in Table 4 below.

The glass transition point of the copolymer after the stretching process was 150° C. and after the 130° C. heat-treatment, it was as follows.

| Heat-Treatment Time (hr) | Glass Transition Point (°C.) |
| --- | --- |
| 1 | 158 |
| 2 | 165 |
| 5 | 168 |
| 10 | 170 |

TABLE 4

| Run No. | Heat-Treatment Temperature (°C.) | Heat-Treatment Time (hr) | Polarization Temperature (°C.) | $d_{31}$ (pC/N) | $K_t$ |
| --- | --- | --- | --- | --- | --- |
| 1 | 130 | 1 | 130 | 0.8 | — |
| 2 | 130 | 2 | 100 | 0.5 | — |
| 3 | 130 | 2 | 130 | 1.5 | — |
| 4 | 130 | 5 | 130 | 1.8 | — |
| 5 | 130 | 5 | 140 | 2.2 | 0.06 |
| 6 | 130 | 10 | 100 | 0.8 | — |
| 7 | 130 | 10 | 130 | 2.0 | 0.06 |
| 8 | 130 | 10 | 140 | 3.3 | 0.10 |
| 9 | 130 | 10 | 150 | 5.9 | 0.18 |

EXAMPLE 5

An alternating copolymer of vinylidene cyanide and vinyl benzoate was dissolved in DMA. Using the resulting solution, a film was produced by the solvent casting method. This film was then press-molded at 170° C. to produce a substantially unoriented film having a thickness of about 100 μm. The film was uniaxially stretched to about 3 times in an oven maintained at 160° C. At a constant film thickness while applying tension in the stretching direction, a heat-treatment and a polarization treatment were carried out in the same manner as in Example 1. The thus-obtained film was measured for the piezoelectric constants, $d_{31}$ and $K_t$. The results obtained are shown in Table 5 below.

The glass transition point of the copolymer after the stretching process was 168° C., and after the 160° C. heat-treatment, it was as follows.

| Heat-Treatment Time (hr) | Glass Transition Point (°C.) |
| --- | --- |
| 1 | 168 |
| 2 | 170 |
| 5 | 175 |
| 10 | 175 |

TABLE 5

| Run No. | Heat-Treatment Temperature (°C.) | Heat-Treatment Time (hr) | Polarization Temperature (°C.) | $d_{31}$ (pC/N) | $K_t$ |
| --- | --- | --- | --- | --- | --- |
| 1 | 160 | 1 | 150 | 1.2 | — |
| 2 | 160 | 2 | 100 | 0.8 | — |
| 3 | 160 | 2 | 150 | 2.5 | 0.08 |
| 4 | 160 | 2 | 160 | 3.8 | 0.11 |
| 5 | 160 | 5 | 150 | 5.0 | 0.14 |
| 6 | 160 | 10 | 25 | 0.5 | — |
| 7 | 160 | 10 | 120 | 1.8 | — |
| 8 | 160 | 10 | 150 | 5.6 | 0.16 |
| 9 | 160 | 10 | 170 | 6.2 | 0.19 |

EXAMPLE 6

A 3-times stretched film as produced in Example 2 was heat-treated at 160° C. for 2 hours and then was subjected to a polarization treatment under conditions of temperature: 170° C., electric field strength: 400 kv/cm, and time: 2 hours. The thus-obtained electret element was measured for changes in piezoelectric constants when maintained at 80° C. and 150° C. The results obtained are shown in Table 6 below.

It can be seen from Table 6 that almost no reduction in piezoelectric constants is observed even after the electret was maintained at 150° C. for 100 days.

TABLE 6

| Run No. | Temperature (°C.) | Time (days) | $d_{31}$ (pC/N) | $K_t$ |
| --- | --- | --- | --- | --- |
| 1 | 80 | 0 | 10.2 | 0.25 |
| 2 | 80 | 1 | 10.8 | 0.27 |
| 3 | 80 | 3 | 10.5 | 0.26 |
| 4 | 80 | 5 | 10.0 | 0.24 |
| 5 | 80 | 10 | 10.1 | 0.24 |
| 6 | 80 | 50 | 9.8 | 0.25 |
| 7 | 80 | 100 | 10.1 | 0.23 |
| 8 | 80 | 200 | 10.0 | 0.24 |
| 9 | 80 | 300 | 9.8 | 0.23 |
| 10 | 150 | 1 | 10.2 | 0.25 |
| 11 | 150 | 100 | 10.0 | 0.24 |

COMPARATIVE EXAMPLE

A polymeric electret element was produced in the same manner as in Example 1 except that the heat-treatment was not applied. This element was measured for the piezoelectric constants, $d_{31}$ and $K_t$. The results obtained are shown in Table 1 (Run No. 10).

REFERENCE EXAMPLE

A vinylidene fluoride resin was melt extrusion-molded in the conventional manner to produce an unoriented film. This film was oriented by monoaxially stretching to about 4 times in an oven maintained at 60° C., and then a DC electric field as shown in Table 7 was applied at 90° C. for 1 hour to obtain an electret element. This electret element was measured for the piezoelectric constants, $d_{31}$ and $K_t$. The results obtained are shown in Table 7 below.

In addition, an electret element produced by applying a polarization treatment under conditions of temperature 90° C., electric field strength 1,000 kv/cm and time 1 hour was measured for changes in piezoelectric constants with the passage of time when maintained at 80° C. and 150° C.

TABLE 7

| Run No. | Electric Field Strength (kv/cm) | $d_{31}$ (pC/N) | $K_t$ |
|---|---|---|---|
| 1 | 400 | 12.3 | 0.09 |
| 2 | 600 | 18.5 | 0.14 |
| 3 | 800 | 23.4 | 0.16 |
| 4 | 1,000 | 26.0 | 0.18 |
| 5 | 1,200 | 32.6 | 0.22 |
| 6 | 1,800 | 41.5 | 0.25 |

TABLE 8

| Run No. | Temperature (°C.) | Time (days) | $d_{31}$ (pC/N) | $K_t$ |
|---|---|---|---|---|
| 1 | 80 | 0 | 26.0 | 0.18 |
| 2 | 80 | 1 | 24.4 | 0.17 |
| 3 | 80 | 3 | 23.7 | 0.16 |
| 4 | 80 | 5 | 23.0 | 0.16 |
| 5 | 80 | 10 | 22.8 | 0.16 |
| 6 | 80 | 50 | 21.6 | 0.15 |
| 7 | 80 | 100 | 20.8 | 0.14 |
| 8 | 80 | 200 | 20.0 | 0.14 |
| 9 | 80 | 300 | 19.9 | 0.13 |
| 10 | 150 | 1 | 0 | 0 |

In accordance with the present invention, a molded article of a vinylidene cyanide copolymer is subjected to poling after or simultaneously with a heat-treatment at a temperature not higher than the glass transition temperature thereof, whereby a polymeric electret element which is superior in moldability and flexibility and is thermally stable over long periods of time can be obtained. Thus, the molded article can be widely used in the fields utilizing piezoelectric properties, such as electro-acoustic conversion elements (e.g., a microphone, a headphone, a speaker, and a ultrasonic element), electro-mechanic conversion elements, pressure-sensitive elements, and bimorph elements. Although the present invention has been described above in connection with piezoelectric properties, a membrane produced by the present invention also exhibits a pyroelectric effect. It can be said from experience that a material having a high degree of Kt exhibits a high pyroelectric effect. Thus, the membrane can be used in applications utilizing the pyroelectric properties, such as infrared ray- or microwave-detecting elements, and image-recording light-sensitive elements for long wavelength light. Moreover, the membrane exhibits a high longitudinal piezoelectric effect and is transparent. Thus, it can be used as an optoelectronic device such as a light-recording material, a light frequency-conversion element, a light-modulation element, a light switch, a light-polarization element, a space conversion element, and a light calculation element.

While the invention has been described in detail and with reference to specific embodiments thereof, it will be apparent to one skilled in the art that various changes and modifications can be made therein without departing from the spirit and scope thereof.

What is claimed is:

1. A method of producing a polymeric electret element, which comprises;

heat-treating a molded article of a copolymer comprising vinylidene cyanide represented by the formula:

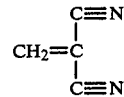

and a comonomer selected from the group consisting of vinyl compounds, other vinylidene compounds and dienes at a temperature not higher than the glass transition temperature thereof for a time represented by equation (I) before or simultanesouly with poling:

$$\frac{t_1}{(T_g^0 - T_1) + 80} + \frac{t_2}{(T_g^1 - T_2) + 80} > A \qquad (I)$$

where
$t_1$ = heat-treatment time (hr),
$t_2$ = polarization treatment time (hr),
$T_g^0$ = glass transition temperature of copolymer prior to heat-treatment,
$T_g^1$ = glass transition temperature of copolymer prior to polarization treatment and is defined by the relationship: $T_g^0 - 80 \leq T_1 \leq T_g^0$,
$T_1$ = heat-treatment temperature and is defined by the relationship; $T_g^1 - 100 \leq T_2 \leq T_g^1$, $T_2$ = polarization treatment temperature, and
$A = 1/80$
provided that both $t_1$ and $t_2$ are negative.

2. The method as claimed in claim 1, wherein the heat-treatment temperature is within a range of from 0° to 80° C. lower than the glass transition temperature of the molded article prior to the heat-treatment.

3. The method as claimed in claim 1, wherein the heat-treatment temperature is within a range of from 0° to 30° C. lower than the glass transition temperature of the molded article prior to the heat-treatment.

4. The method as claimed in claim 1, wherein the heat-treatment time is 2.0 hours or more.

5. The method as claimed in claim 1, wherein the polarization treatment is carried out after the heat-treatment.

6. The method as claimed in claim 1, wherein the molded article is uniaxially stretched by a factor of from 2 to 6 times its original length, and then it is subjected to the heat-treatment and polarization treatment.

7. The method as claimed in claim 1, wherein the molded article is uniaxially stretched by a factor of from 2 to 6 times its original length, is subjected to the heat-treatment, and then is subjected to the polarization treatment.

8. The method as claimed in claim 1, wherein A is 1/30.

9. The method as claimed in claim 1, wherein said vinyl compound is styrene, dichlorostyrene, arcylic acid, an acrylic acid ester, methacrylic acid, a methacrylic acid ester, vinyl alcohol, a vinyl alcohol ester, vinyl, chloride, vinyl fluoride, isobutylene, maleic anhydride, acrylonitrile, α-chloroacrylonitrile, methyl vinyl ketone, vinyl isobutyl ether, or cyano acrylate.

10. The method as claimed in claim 1, wherein said vinylidene compound is vinylidene chloride, vinylidene fluoride or ethylene trifluoride.

11. The method as claimed in claim 1, wherein said diene compound is butadiene or chlorobutadiene.

12. The method as claimed in claim 1, wherein the molar ratio of vinylidene cyanide to other comonomer ranges from 0.5:1 to 1.5:1.

13. The method as claimed in claim 1, wherein said vinylidene cyanide copolymer has an intrinsic viscosity as measured in dimethylformamide at 25° C. of from 0.1 to 15.

14. The method as claimed in claim 13, wherein said intrinsic viscosity ranges from 0.5 to 13.

15. The method as claimed claim 14, wherein said intrinsic viscosity ranges from 2 to 7.

16. The method as claimed in claim 1, wherein the poling treatment is conducted at a temperature ranging from 0° to 180° C.

17. The method as claimed in claim 1, wherein said poling treatment is conducted with an applied electric field strength of from 10 kv/cm to such a level that dielectric breakdown of the copolymer does not occur.

* * * * *

UNITED STATES PATENT AND TRADEMARK OFFICE
CERTIFICATE OF CORRECTION

PATENT NO. : 4,591,465

DATED : May 27, 1986

INVENTOR(S) : SEIZO MIYATA ET AL

It is certified that error appears in the above-identified patent and that said Letters Patent is hereby corrected as shown below:

Claim 1, last line, after "are", insert - - - not - - -.

Signed and Sealed this

Second Day of September 1986

[SEAL]

Attest:

DONALD J. QUIGG

Attesting Officer

Commissioner of Patents and Trademarks